(12) United States Patent
Hirano et al.

(10) Patent No.: US 6,459,299 B1
(45) Date of Patent: Oct. 1, 2002

(54) TRISTATE BUFFER

(75) Inventors: Masashi Hirano, Tokyo-to; Takeshi Yoshida; Shigeyuki Hayakawa, both of Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 71 days.

(21) Appl. No.: 09/663,368

(22) Filed: Sep. 15, 2000

(30) Foreign Application Priority Data

Sep. 16, 1999 (JP) ............................................ 11-262678

(51) Int. Cl.[7] ............................................... H03K 19/02
(52) U.S. Cl. ............................... 326/56; 326/57; 326/58
(58) Field of Search .............................. 326/21, 26, 27, 326/28, 56, 57, 58; 327/379, 388, 389, 108, 112

(56) References Cited

U.S. PATENT DOCUMENTS 6,292,025 B1 * 9/2001 Okumura ..................... 326/58
6,329,840 B1 * 12/2001 Moyal ......................... 326/58

* cited by examiner

*Primary Examiner*—Tuan T. Lam
(74) *Attorney, Agent, or Firm*—Oblon, Spivak, McClelland, Maier & Neustadt, P.C.

(57) ABSTRACT

A tristate buffers includes a logic circuit which outputs a high-level signal. The output signal is fed to gates of 1st and 2nd P-channel MOS transistors (TRs). A 3rd PMOS TR has a gate connected to a drain of the 2nd PMOS TR, and a drain connected to a drain of the 1st PMOS TR. A 4th PMOS TR has a gate connected to the drain of the 1st PMOS TR, and a drain connected to the drain of the 2nd PMOS TR. A 1st NMOS TR and a 2nd NMOS TR have their drains connected respectively to the drains of the 1st and the 3rd PMOS TRs and the drains of the 2nd and the 4th PMOS TRs. A 3rd NMOS TR and a 4th NMOS TR are connected respectively between the source of the 1st NMOS TR and ground and the source of the 2nd NMOS TR and the ground. The drains of the 1st and the 3rd PMOS TRs and the 1st NMOS TR are connected to an inverter. A 5th PMOS TR is connected to the drains of the 2nd and the 4th PMOS TRs and the 2nd NMOS TR. A 5th NMOS TR is connected between the signal output and the ground and is fed on its gate by the inverter output.

10 Claims, 5 Drawing Sheets

TRISTATE BUFFER

BACKGROUND OF THE INVENTION

The present invention relates to a tristate buffer.

Figure 1:
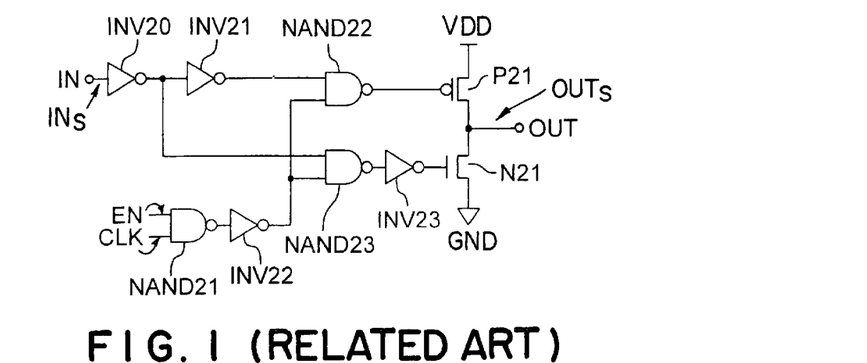
FIG. 1 shows a logic circuit diagram of a typical tristate buffer.

Shown in FIG. 1 is a logic circuit diagram of a typical tristate buffer.

In FIG. 1, an input signal INs is fed to an inverter INV20 via a signal input terminal IN. The output signal of the inverter INV20 is fed to an inverter INV21. A clock signal CLK and an enable signal EN are fed to a 2-input NAND gate 21. The output signal of the NAND gate 21 is fed to an inverter INV22. The output signals of the inverters INV21 and INV22 are fed to a 2-input NAND gate 22. The output signals of the inverters INV20 and INV22 are fed to a 2-input NAND gate 23. The output signal of the NAND gate 23 is fed to an inverter INV23. The output signal of the NAND gate 22 is fed to the gate of a P-channel MOS transistor P21 connected across a power supply terminal VDD and a signal output terminal OUT for generating an output signal OUTs. The output signal of the inverter INV23 is fed to the gate of an N-channel MOS transistor N21 connected across the signal output terminal OUT and a ground terminal GND.

Figure 2:
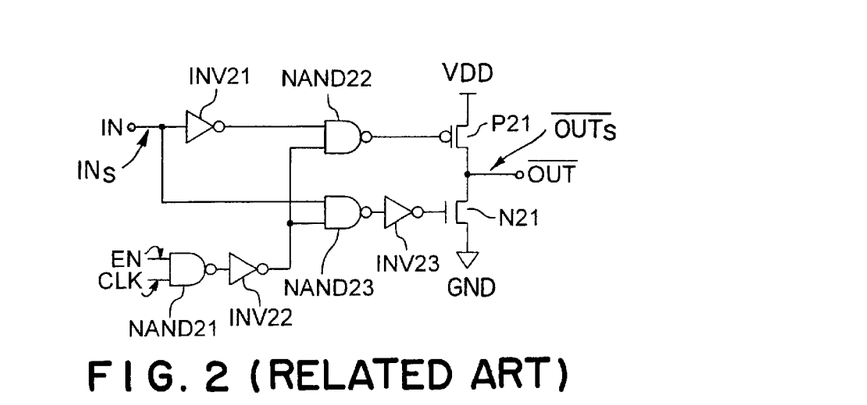
FIG. 2 shows another logic circuit diagram of a typical tristate buffer.

Shown in FIG. 2 is a logic circuit diagram of another typical tristate buffer.

The tristate buffer of FIG. 2 is different from that shown in FIG. 1 in that it does not have an inverter for inverting an input signal, such as, the inverter INV20 shown in FIG. 1. An output signal /OUTs is generated at the signal output terminal OUT, which is an inverted signal of the output signal OUTs shown in FIG. 1. The sign "/" indicates logic inversion hereinafter.

The operation of the tristate buffer shown in FIG. 1 only is explained because that of the tristate buffer of FIG. 2 is almost the same.

Figure 3:
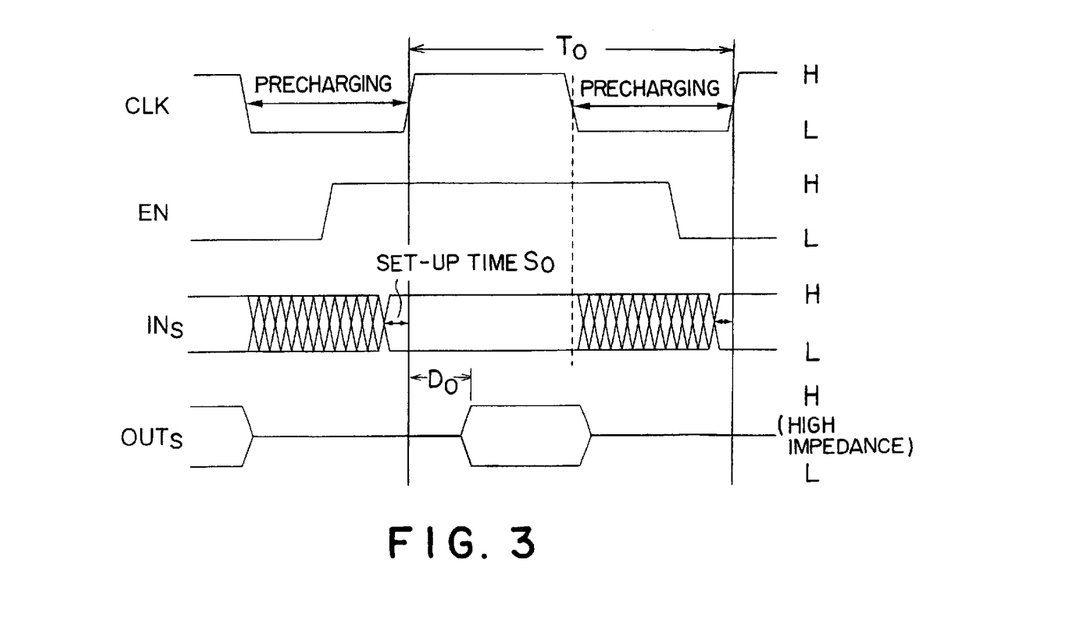
FIG. 3 shows a timing chart of the signals on the tristate buffer shown in FIG. 1.

The timing chart for signals on the tristate buffer (FIG. 1) is shown in FIG. 3.

The clock signal CLK having a period of $T_0$ offers a pre-charging period to the tristate buffer while the signal CLK is in a L (low)-level state. The P-and N-channel MOS transistors P21 and N21 (the output stage) are off during the pre-charging period, thus the signal output terminal OUT having high impedance.

On the other hand, the clock signal CLK offers an evaluation period while it is in a H (high)-level state. The enable signal EN in a L-level state during the evaluation period makes the signal output terminal OUT continuously having high impedance.

The output signal OUTs goes to a H-level state when the input signal INs goes to a H-level state while the enable signal EN is in a H-level state. On the other hand, the output signal OUTs goes to a L-level state when the input signal INs goes to a L-level state while the enable signal EN is in the H-level state.

The tristate buffer must have a sufficient set-up time $S_0$ for the input signal INs against a leading timing of the clock signal CLK. In other words, as shown in FIG. 3, a sufficient set-up time So should be provided for the input signal INs for the transition from an unstable state between H- and L-levels to a stable state in a H- or a low-level before the leading timing of the clock signal CLK.

Transition from the unstable to stable states behind the leading timing of the clock signal CLK would cause discharging at the signal out terminal OUT to bring the circuitry (not shown) connected to the terminal OUT into a malfunction.

The sooner the better for the tristate buffer to have a set-up time $S_0$ for achieving a higher operating speed. When the output passage of the input signal INs from an input signal generator (not shown) is the critical path, an operation period of the input signal generator and the tristate buffer is obtained by addition of a period of generating the input signal INs and a set-up time $S_0$. In other words, the sooner to have a set-up time $S_0$, the higher the operating frequency.

The tristate buffer shown in FIG. 1 is, however, provided with two inverters (INV20 and INV21) connected in series between the signal input terminal IN and the 2-input NAND gate NAND22. The installation of such inverters causes a delay $D_0$ for the output signal OUTs as shown in FIG. 3, thus having a slow operating speed.

In order to solve such a problem, the tristate buffer shown in FIG. 2 is provided with only one inverter INV21 between the signal input terminal IN and the 2-input NAND gate NAND22.

The tristate buffer (FIG. 2) is, however, put under load corresponding to P- and N-channel MOS transistors that constitute the inverter INV21 and also those constituting the 2-input NAND gate NAND23 when looked from the signal input IN.

This results in increase in load for the tristate buffer shown in FIG. 2 compared to that shown in FIG. 1, thus no increase in operating speed.

SUMMARY OF THE INVENTION

A purpose of the present invention is to provide a tristate buffer that operates at a high operating speed by reduction of load when looked from an signal input terminal to produce a small signal delay.

The present invention provides a tristate buffer including: a logic circuit to output a H (high)-level signal when H-level clock and enable signals are input thereto; a first P-channel MOS transistor having a source connected to a power supply terminal of the tristate buffer and a gate to which the output signal of the logic circuit is supplied; a second P-channel MOS transistor having a source connected to the power supply terminal and a gate to which the output signal of the logic circuit is supplied; a third P-channel MOS transistor having a source connected to the power supply terminal, a gate connected to a drain of the second P-channel MOS transistor, and a drain connected to a drain of the first P-channel MOS transistor; a fourth P-channel MOS transistor having a source connected to the power supply terminal, a gate connected to the drain of the first P-channel MOS transistor, and a drain connected to the drain of the second P-channel MOS transistor; a first N-channel MOS transistor having a drain connected to the drains of the first and the third P-channel MOS transistors and a gate to which the output signal of the logic circuit is supplied; a second N-channel MOS transistor having a drain connected to the drains of the second and the fourth P-channel MOS transistors and a gate to which the output signal of the logic circuit is supplied; a third N-channel MOS transistor connected between a source of the first N-channel MOS transistor and a ground terminal of the tristate buffer, a first input signal being fed to a gate of the third N-channel MOS transistor; a fourth N-channel MOS transistor connected between the source of the second N-channel MOS transistor and the ground terminal, a second input signal being fed to a gate of the fourth N-channel MOS transistor; an inverter having an input terminal connected to the drains of the first and the third P-channel MOS transistors and also the first N-channel MOS transistor; a fifth P-channel MOS transistor connected between the power supply terminal and an signal output terminal of the tristate buffer, a gate of the fifth P-channel MOS transistor being connected to the drains of the second and the fourth P-channel MOS transistors and also the second N-channel MOS transistor; and a fifth N-channel MOS transistor connected between the signal output terminal and the ground termial, an output signal of the inverter being fed to a gate of the fifth N-channel MOS transistor.

Moreover, the present invention provides a tristate buffer including: a logic circuit to output a H (high)-level signal when H-level clock and enable signals are input thereto; a first P-channel MOS transistor having a source connected to a power supply terminal of the tristate buffer and a gate to which the output signal of the logic circuit is supplied; a second P-channel MOS transistor having a source connected to the power supply terminal and a gate to which the output signal of the logic circuit is supplied; a third P-channel MOS transistor having a source connected to the power supply terminal, a gate connected to a drain of the second P-channel MOS transistor, and a drain connected to a drain of the first P-channel MOS transistor; a fourth P-channel MOS transistor having a source connected to the power supply node, a gate connected to the drain of the first P-channel MOS transistor, and a drain connected to the drain of the second P-channel MOS transistor; a first N-channel MOS transistor having a drain connected to the drains of the first and the third P-channel MOS transistors and a gate connected to the drains of the second and the fourth P-channel MOS transistors; a second N-channel MOS transistor having a drain connected to the drains of the second and the fourth P-channel MOS transistors and a gate connected to the drains of the first and the third P-channel MOS transistors; a third N-channel MOS transistor having a drain connected to a source of the first N-channel MOS transistor and a gate to which a first input signal is supplied; a fourth N-channel MOS transistor having a drain connected to a source of the second N-channel MOS transistor, a source connected to a source of the third N-channel MOS transistor, and a gate to which a second input signal is supplied; a fifth N-channel MOS transistor connected between the sources of the third and the fourth N-channel MOS transistors and the ground terminal, and a gate to which the output signal of the logic circuit is supplied; an inverter having an input terminal connected to the drains of the first and the third P-channel MOS transistors and also the drain of the first N-channel MOS transistor; a fifth P-channel MOS transistor connected between the power supply terminal and an signal output terminal of the tristate buffer, a gate of the fifth P-channel MOS transistor being connected to the drains of the second and the fourth P-channel MOS transistors and also the drain of the second N-channel MOS transistor; and a sixth N-channel MOS transistor connected between the signal output terminal and the ground termial, an output signal of the inverter being fed to a gate of the sixth N-channel MOS transistor.

DETAILED DESCRIPTION OF PREFERRED EMBODIMENTS

Preferred embodiments of a tristate buffer according to the present invention will be disclosed with reference to the attached drawings.

The present invention achieves decrease in load when looked from a signal input terminal for a quick transition (set-up time) of an input signal from an unstable to a stable state for a high operating speed.

Figure 4:
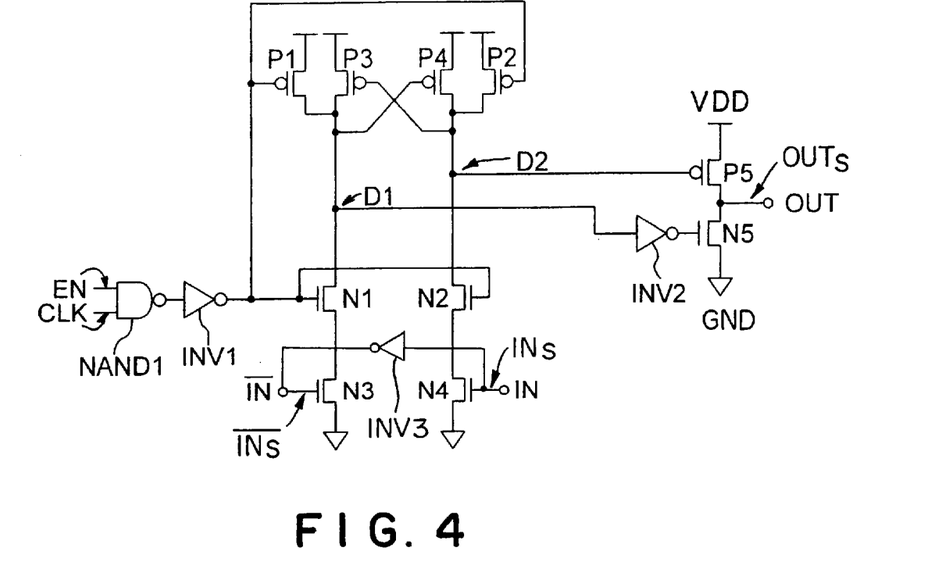
FIG. 4 shows a logic circuit diagram of the first preferred embodiment of a tristate buffer according to the present invention.

Shown in FIG. 4 is a circuit diagram of the first preferred embodiment of a tristate buffer.

In FIG. 4, a clock signal CLK and an enable signal EN are fed to a 2-input NAND gate NAND1. The output signal of the NAND gate NAND1 is fed to an inverter INV1. The output signal of the inverter INV1 is fed to the gate of a P-channel MOS transistor P1, and also to the gate of a P-channel MOS transistor P2. The sources of the MOS transistors P1 and P2 are connected to a power supply terminal VDD.

The drain of the P-channel MOS transistor P1 is connected to the drain of a P-channel MOS transistor P3, the gate of which is connected to the drain of the P-channel MOS transistor P2. The drain of the MOS transistor P1 is also connected to the gate of a P-channel MOS transistor P4, the drain of which is connected to the drain of the MOS transistor P2. The sources of the MOS transistors P3 and P4 are connected to the power supply terminal VDD.

The drains of the P-channel MOS transistors P1 and P3 are connected to the drain of an N-channel MOS transistor N1. The output signal of the inverter INV1 is fed to the gate of the MOS transistor N1.

The drains of the P-channel MOS transistors P2 and P4 are connected to the drain of an N-channel MOS transistor N2. The output signal of the inverter INV1 is also fed to the gate of the MOS transistor N2.

An N-channel MOS transistor N3 is connected across the source of the N-channel MOS transistor N1 and a ground terminal GND. An N-channel MOS transistor N4 is connected across the source of the N-channel MOS transistor N2 and the ground terminal GND.

An input signal INs is fed to the gate of the N-channel MOS transistor N4. The input signal INs is also fed to the gate of the N-channel MOS transistor N3 via an inverter INV3, as an inverted input signal /INs.

The drain of the N-channel MOS transistor N1 is connected to the gate of an N-channel MOS transistor N5 via an inverter INV2. The drain of the N-channel MOS transistor N2 is connected to the gate of a P-channel MOS transistor P5.

The drain of the P-channel MOS transistor P5 is connected to the power supply terminalt VDD. The source of the N-channel MOS transistor N5 is connected to the ground terminal GND.

The source of the P-channel MOS transistor P5 and the drain of the N-channel MOS transistor N5 are connected to a signal output terminal OUT for generating an output signal OUTs.

The 2-input NAND gate NAND1 and the inverter INV1 can be replaced with one 2-input NAND gate.

Figure 5:
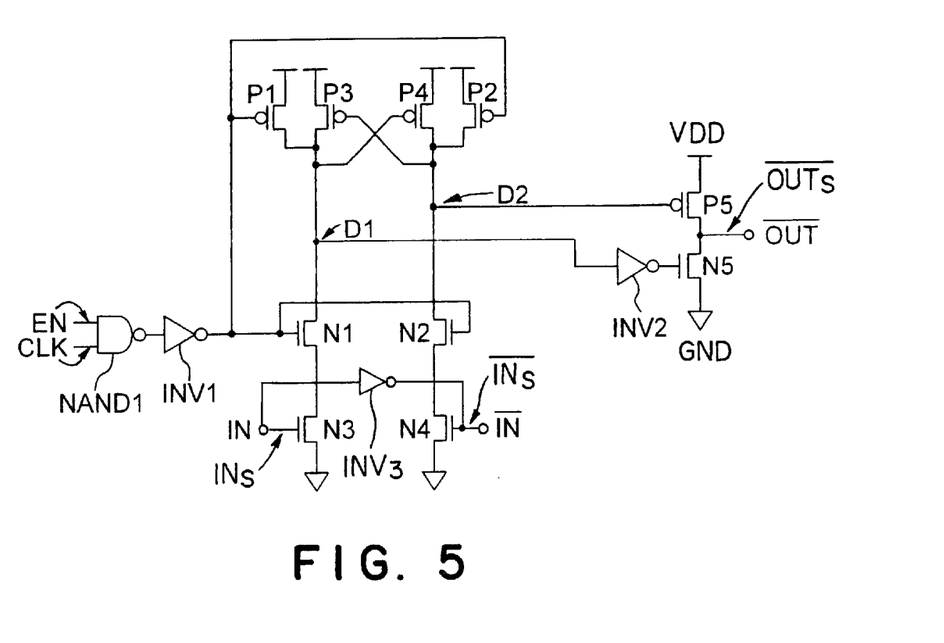
FIG. 5 shows a logic circuit diagram of a modification of the first embodiment of a tristate buffer according to the present invention.

Shown in FIG. 5 is a circuit diagram of a modification of the first embodiment of a tristate buffer according to the present invention.

The diference between the first embodiment and the modification is that the input signals INs and /INs fed to the gates of the N-channel MOS transistors N3 and N4 are reversed. Therefore, the tristate buffer shown in FIG. 4 generates the outputs signal OUTs, whereas the modification shown in FIG. 5 generates the output signal /OUTs.

The operation of the first embodiment and the modification are almost the same; hence the operation of the tristate buffer shown in FIG. 4 only is described in detail.

Figure 6:
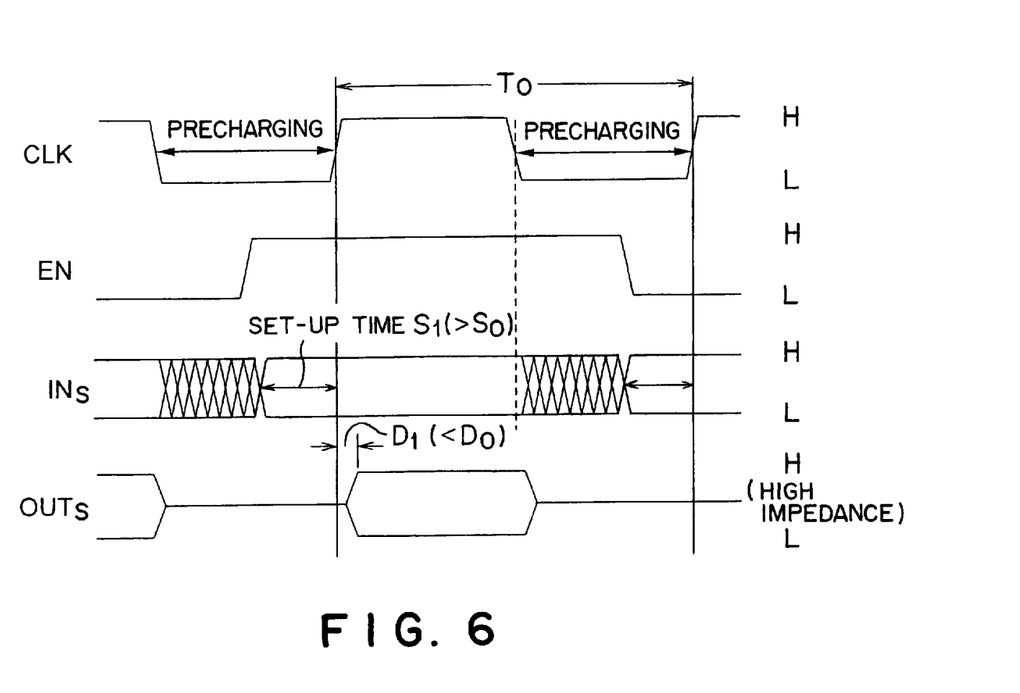
FIG. 6 shows a timing chart of the signals on the first embodiment of a tristate buffer.

FIG. 6 is a timing chart of signals on the tristate buffer shown in FIG. 4.

The clock signal CLK having a period of To, the same as shown in the timing chart of FIG. 3, offers a pre-charging period for the tristate buffer while the signal CLK is in a L (low)-level state. The P-channel MOS transistors P1 and P2 are on while the N-channel MOS transistors N1 and N2 are on off during the pre-charging period, thus nodes D1 and D2 being charged to a H-level state. The H-level state turns off the P-channel MOS transistor P5 and the N-channel MOS transistor N5 (the output stage), which makes the signal output terminal OUT having high impedance.

On the other hand, the clock signal CLK offers an evaluation period while it is in a H (high)-level state. The enable signal EN in a L-level state during the evaluation period makes the signal output terminal OUT continuously having high impedance.

Transition of the enable signal EN from the L- to H-level state during the evaluation period turns off the P-channel MOS transistors P1 and P2 while turns on the N-channel MOS transistors N1 and N2.

The input signal INs in a L-level state turns on N-channel MOS transistor N3 while turns off the N-channel MOS transistor N4, which causes discharging at the node D1. This results in the N-channel MOS transistor N5 and also the P-channel MOS transistor N4 being turned on to cause the node D2 to keep the H-level state. The H-level state turns off the P-channel MOS transistor P5 to output a L-level output signal OUTs via the output terminal OUT.

On the other hand, the input signal INs in a H-level state turns off the N-channel MOS transistor N3 while turns on the N-channel MOS transistor N4, which causes discharging at the node D2. This results in the P-channel MOS transistor P5 and also the P-channel MOS transistor P3 being turned on to cause the node D1 to keep the H-level state. The H-level state turns off the N-channel MOS transistor N5 to output a H-level output signal OUTs via the output terminal OUT.

The difference in operation between the tristate buffer shown in FIG. 4 and the modification shown in FIG. 5 is only that an output signal level is reversed; hence the operation of the modification is omitted for berevity.

In the tristate buffers shown in FIGS. 4 and 5 as the first embodiment according to the present invention, an inverter INV3 for generating an inverted input signal /INS only is provided between the signal input terminal IN and the gates of the N-channel MOS transistors N3 and N4 to be driven by the input signal INs.

Figure 7:
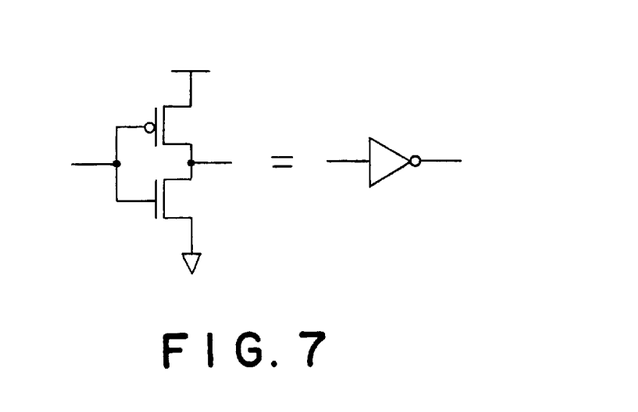
FIG. 7 shows a circuit diagram of an inverter.

Therefore, the load when looked from the signal input terminal IN corresponds to P- and N-channel MOS transistors, shown in FIG. 7, that constitute the inverter INV3, and the N-channel MOS transistor N4.

Figure 8:
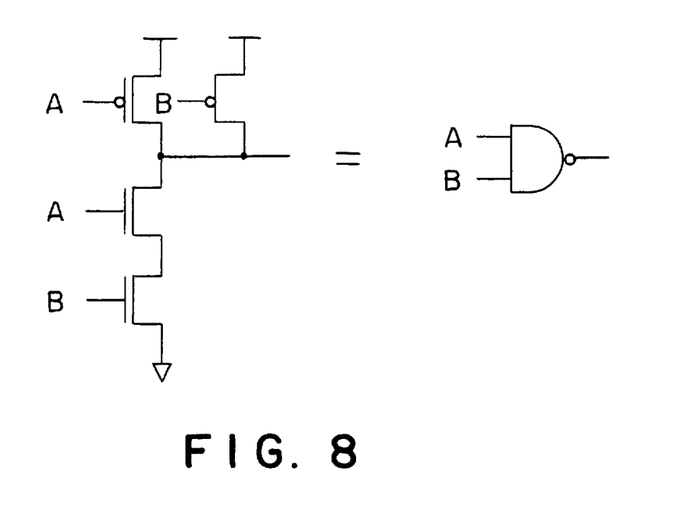
FIG. 8 shows a circuit diagram of a 2-input NAND gate.

On the contrary, the load for the tristate buffer shown in FIG. 2 when looked from the signal input terminal IN corresponds to P- and N-channel MOS transistors, shown in FIG. 7, that constitute the inverter INV21, and two P-channel MOS transistors and two N-channel MOS transistors, shown in FIG. 8, that constitute the 2-input NAND gate NAND23.

The present invention thus achieves reduction of load in the tristate buffer shown in FIG. 4 by two P-channel MOS transistors and one N-channel MOS transistor, compared to the tristate buffer of FIG. 2.

The input signal is quickly brought into a H- or L-stable state according to the reduction of load, thus providing a set-up time Si as shown in FIG. 6, which is longer than the set-up time So shown in FIG. 3.

Moreover, the tristate buffer shown in FIG. 4 is provided only with the two series-connected N-channel MOS transistors N2 and N4 between the signal input terminal IN and the node D2 via which the output P-channel MOS transistor P5 is driven, and also the two series-connected N-channel MOS transistors N1 and N3 between the inverted signal input terminal /IN and the node D1 via which the output N-channel MOS transistor N5 is driven.

This circuit arrangement produces a signal delay $D_1$ for the output signal OUTs as shown in FIG. 6, which is smaller than the delay $D_0$ shown in FIG. 3, thus avoiding decrease in circuit operating speed.

Figure 9:
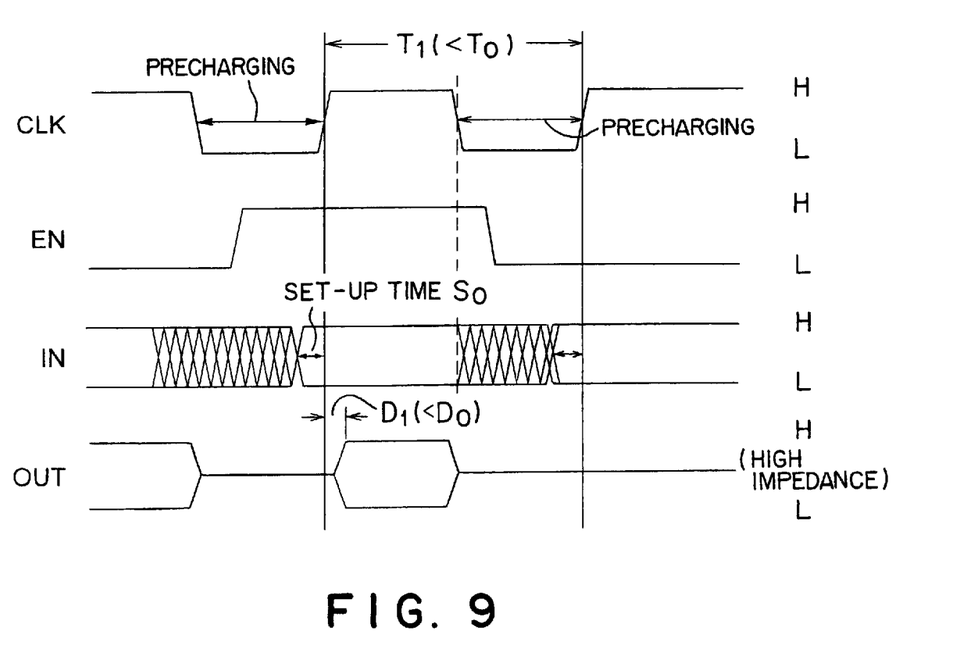
FIG. 9 shows another timing chart of signals on the first embodiment of a tristate buffer.

When the tristate buffer shown in FIG. 4 requires a short set-up time, such as, $S_0$ shown in FIG. 3 instead of $S_1$ (FIG. 6), a period of clock signal CLK can be shortened, such as, $T_1$ shown in FIG. 9, or a high operating frequency can be used.

Figure 10:
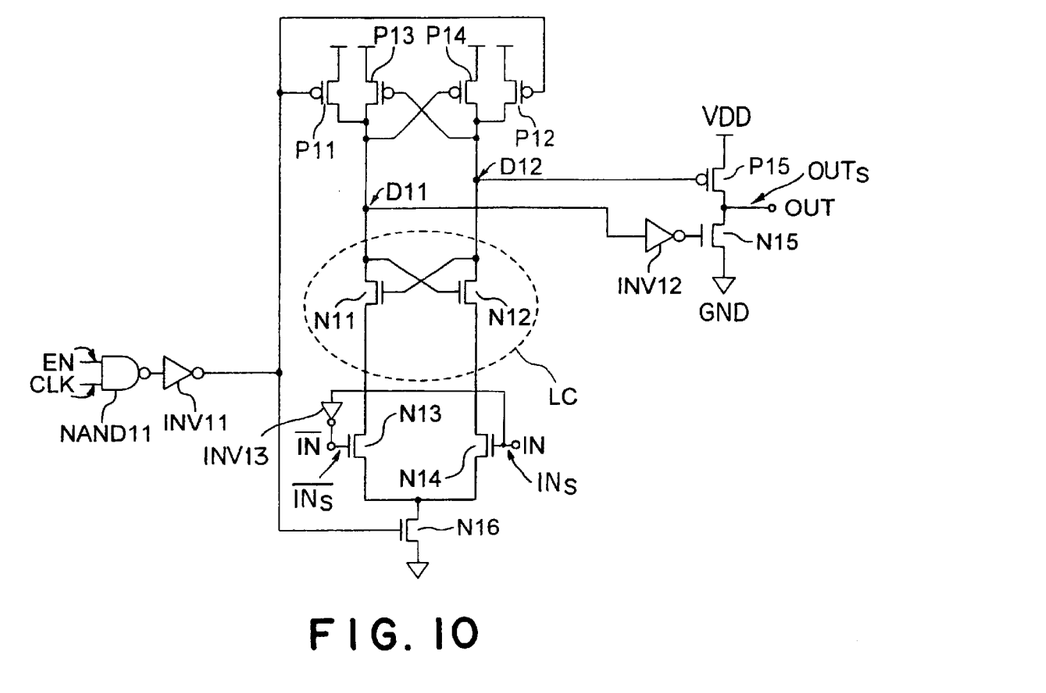
FIG. 10 shows a logic circuit diagram of the second preferred embodiment of a tristate buffer according to the present invention.

Shown next in FIG. 10 is a logic circuit diagram of the second preferred embodiment of a tristate buffer according to the present invention.

Typical tristate buffers require a constant input signal INs in the evaluation period. The tristate buffer shown in FIG. 10 as the second preferred embodiment according to the present invention is provided with a latch in addtion to the circuit components of the tristate buffer shown in FIG. 4 as the first preferred embodiment according to the present invention.

In FIG. 10, a clock signal CLK and an enable signal EN are fed to a 2-input NAND gate NAND11. The output signal of the NAND gate NAND11 is fed to an inverter INV11. The output signal of the inverter INV11 is fed to the gate of a P-channel MOS transistor P11, and also to the gate of a P-channel MOS transistor P12. The sources of the MOS transistors P11 and P12 are connected to a power supply terminal VDD.

The drain of the P-channel MOS transistor P11 is connected to the drain of a P-channel MOS transistor P13, the gate of which is connected to the drain of the P-channel MOS transistor P12. The drain of the MOS transistor P11 is also connected to the gate of a P-channel MOS transistor P14, the drain of which is connected to the drain of the MOS transistor P12. The sources of the MOS transistors P13 and P14 are connected to the power supply terminal VDD.

The drains of the P-channel MOS transistors P11 and P13 are connected to the drain of an N-channel MOS transistor N11, the gate of which is connected to the drains of the P-channel MOS transistors P12 and P14.

The drains of the P-channel MOS transistors P12 and P14 are connected to the drain of an N-channel MOS transistor N12, the gate of which is connected to the drains of the P-channel MOS transistors P11 and P13.

The source of the N-channel MOS transistor N11 is connected to the drain of an N-channel MOS transistor N13, to the gate of which an inverse input signal /INs is fed via an inverter INV13.

The source of the N-channel MOS transistor N12 is connected to the drain of an N-channel MOS transistor N14, to the gate of which an input signal INs is fed.

An N-channel MOS transistor N16 is connected between the sources of the N-channel MOS transistors N13 and N14, and a ground terminal GND. The output signal of the inverter INV11 is fed to the gate of the N-channel MOS transistor N16.

The drain of the N-channel MOS transistor N11 is connected to the gate of an N-channel MOS transistor N15 via an inverter INV12. The drain of the N-channel MOS transistor N12 is connected to the gate of a P-channel MOS transistor P15.

The drain of the P-channel MOS transistor P15 is connected to the power supply terminalt VDD. The source of the N-channel MOS transistor N15 is connected to the ground terminal GND.

The source of the P-channel MOS transistor P15 and the drain of the N-channel MOS transistor N15 are connected to a signal out terminal OUT for generating an output signal OUTS.

The N-channel MOS transistors N11 and N2 constitute a latch LC.

The inverted input signal /INs is generated by feeding the input signal INs to the inverter INV13.

The 2-input NAND gate NAND11 and the inverter INV11 can be replaced with one 2-input NAND gate.

Figure 11:
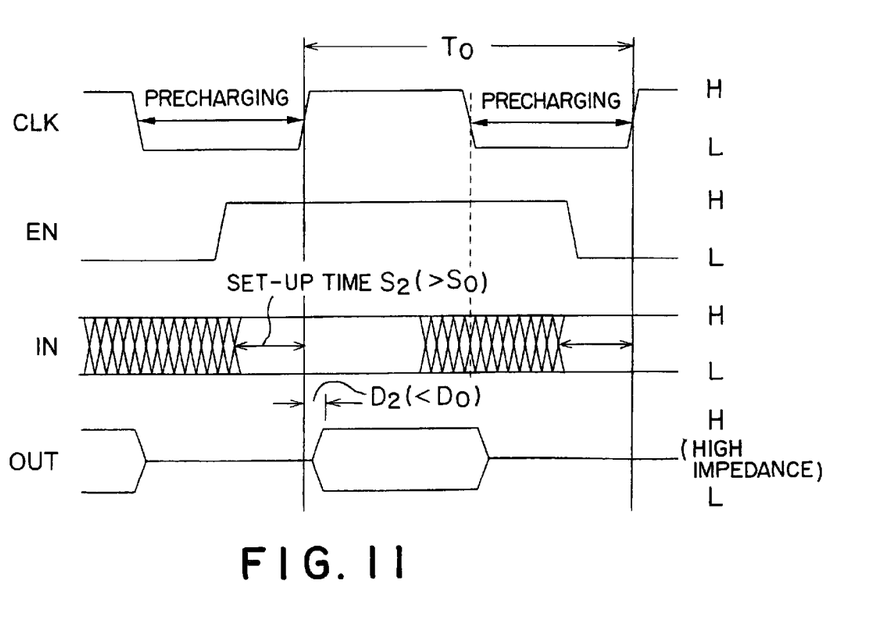
FIG. 11 shows a timing chart of the signals on the second embodiment of a tristate buffer.

FIG. 11 is a timing chart of the signals on the tristate buffer shown in FIG. 10.

The clock signal CLK having a period of $T_0$, the same as shown in the timing chart of FIG. 3, offers a pre-charging period for the tristate buffer while the signal CLK is in a L-level state. The P-channel MOS transistors P11 and P12, and also the N-channel MOS transistors N11 and N12 (the latch LC) are all on while the N-channel MOS transistor N16 is off during the pre-charging period, thus nodes D11 and D12 being charged to a H-level state. The H-level state turns off the P-channel MOS transistor P15 and the N-channel MOS transistor N15 (the output stage), which makes the signal output terminal OUT having high impedance.

On the other hand, the clock signal CLK offers an evaluation period while it is in a H-level state. The enable signal EN in a L-level state during the evaluation period makes the signal output terminal OUT continuously having high impedance.

Transition of the enable signal EN from the L- to H-level state during the evaluation period turns off the P-channel MOS transistors P11 and P12 so that the nodes D11 and D12 are still in the H-level state, while the N-channel MOS transistor P16 is turned off.

The input signal INs in a L-level state while the clock signal CLK is in a H-level state turns on N-channel MOS transistor N13 while turns off the N-channel MOS transistor N14, which causes discharging at the node D11. This results in the N-channel MOS transistor N12 being turned off while the the N-channel MOS transistor N15 and the P-channel MOS transistor P14 being turned on to cause the node D2 to keep the H-level state. The H-level state turns on the N-channel MOS transistor N11 while turns off the P-channel MOS transistor P15 to output a L-level output signal OUTs via the output terminal OUT.

The latch LC holds the output signal OUTs at the L-level during the evaluation period, which would otherwise vary due to transition of the input signal IN that triggers the transition of the N-channel MOS transistors N13 and N14.

On the other hand, the input signal INs in a H-level state while the clock signal CLK is in a H-level state turns off N-channel MOS transistor N13 while turns on the N-channel MOS transistor N14, which causes discharging at the node D12. This results in the N-channel MOS transistors N11 and N15 being turned off while the P-channel MOS transistor P13 being turned on to cause the node D11 to keep the H-level state. The H-level state turns on N-channel MOS transistor N12 and the P-channel MOS transistor P15 to output a H-level output signal OUTs via the output terminal OUT.

The latch LC holds the output signal OUTs at the H-level during the evaluation period, which would otherwise vary due to transition of the input signal IN that triggers the transition of the N-channel MOS transistors N13 and N14.

As disclosed above, the second embodiment of a tristate buffer shown in FIG. 10 is provided with the latch LC between the N-channel MOS transistors N13 and N14 (the input stage), and the P-channel MOS transistor P15 and the N-channel MOS transistor N15 (the output stage).

The latch LC offers a stable output signal OUTs that would otherwise vary due to the transition of the input signal IN during the evaluation period after the output signal OUTs has been in a H- or L-level state according to the input signal IN that is at a H- or L-level state when the clock signal CLK goes to a H-level state at the initiation of the evaluation period.

Moreover, the same as the first embodiment of a tristate buffer, the second embodiment achieves reduction of load in the tristate buffer shown in FIG. 10 by two P-channel MOS transistors and one N-channel MOS transistor, compared to the tristate buffer of FIG. 2.

The input signal is quickly brought into a H- or L-stable state according to the reduction of load, thus providing a set-up time $S_2$ as shown in FIG. 11, which is longer than the set-up time SO shown in FIG. 3.

Moreover, the tristate buffer shown in FIG. 10 is provided only with the two series-connected N-channel MOS transistors N12 and N14 between the signal input terminal IN and the node D12 via which the output P-channel MOS transistor P15 is driven, and also the two series-connected N-channel MOS transistors N11 and N13 between the reverse signal input terminal /IN and the node D11 via which the output N-channel MOS transistor N15 is driven.

This circuit arrangement produces a signal delay $D_2$ for the output signal OUTs as shown in FIG. 11, which is smaller than the delay $D_0$ shown in FIG. 3, thus avoiding decrease in circuit operating speed.

Like the modification of the first embodiment of the tristate buffer, the input signal INs and the inverted input signal /INS to be fed to the gates of the N-channel MOS transistors N13 and N14, respectively, can be reversed, which will produce an output signal /OUTS, in the second embodiment.

As disclosed above, load of the tristate buffer according to the present invention can be reduced compared to the typical tristate buffer shown in FIG. 2 when looked from the signal input terminal. The present invention thus offers a sufficiently long set-up time. On the other hand, the present invention offers a high operating frequency if such a long set-up time is not required.

Moreover, only two series-connected MOS transistors are provided between the signal input terminal and the node via which an output MOS transistor is driven. The present invention thus produces a very small delay for avoiding decrease in circuit operating speed.

What is claimed is:

1. A tristate buffer comprising:
    a logic circuit to output a H (high)-level signal when H-level clock and enable signals are input thereto;
    a first P-channel MOS transistor having a source connected to a power supply terminal of the tristate buffer and a gate to which the output signal of the logic circuit is supplied;
    a second P-channel MOS transistor having a source connected to the power supply terminal and a gate to which the output signal of the logic circuit is supplied;
    a third P-channel MOS transistor having a source connected to the power supply terminal, a gate connected to a drain of the second P-channel MOS transistor, and a drain connected to a drain of the first P-channel MOS transistor;
    a fourth P-channel MOS transistor having a source connected to the power supply terminal, a gate connected to the drain of the first P-channel MOS transistor, and a drain connected to the drain of the second P-channel MOS transistor;
    a first N-channel MOS transistor having a drain connected to the drains of the first and the third P-channel MOS transistors and a gate to which the output signal of the logic circuit is supplied;
    a second N-channel MOS transistor having a drain connected to the drains of the second and the fourth P-channel MOS transistors and a gate to which the output signal of the logic circuit is supplied;
    a third N-channel MOS transistor connected between a source of the first N-channel MOS transistor and a ground terminal of the tristate buffer, a first input signal being fed to a gate of the third N-channel MOS transistor;
    a fourth N-channel MOS transistor connected between the source of the second N-channel MOS transistor and the ground terminal, a second input signal being fed to a gate of the fourth N-channel MOS transistor;
    an inverter having an input terminal connected to the drains of the first and the third P-channel MOS transistors and also the first N-channel MOS transistor;
    a fifth P-channel MOS transistor connected between the power supply terminal and an signal output terminal of the tristate buffer, a gate of the fifth P-channel MOS transistor being connected to the drains of the second and the fourth P-channel MOS transistors and also the second N-channel MOS transistor; and
    a fifth N-channel MOS transistor connected between the signal output terminal and the ground termial, an output signal of the inverter being fed to a gate of the fifth N-channel MOS transistor.

2. The tristate buffer according to claim 1, wherein the second input signal is an inverted signal of the first input signal.

3. A tristate buffer comprising:
    a logic circuit to output a H (high)-level signal when H-level clock and enable signals are input thereto;
    a first P-channel MOS transistor having a source connected to a power supply terminal of the tristate buffer and a gate to which the output signal of the logic circuit is supplied;
    a second P-channel MOS transistor having a source connected to the power supply terminal and a gate to which the output signal of the logic circuit is supplied;
    a third P-channel MOS transistor having a source connected to the power supply terminal, a gate connected to a drain of the second P-channel MOS transistor, and a drain connected to a drain of the first P-channel MOS transistor;
    a fourth P-channel MOS transistor having a source connected to the power supply node, a gate connected to the drain of the first P-channel MOS transistor, and a drain connected to the drain of the second P-channel MOS transistor;
    a first N-channel MOS transistor having a drain connected to the drains of the first and the third P-channel MOS transistors and a gate connected to the drains of the second and the fourth P-channel MOS transistors;
    a second N-channel MOS transistor having a drain connected to the drains of the second and the fourth P-channel MOS transistors and a gate connected to the drains of the first and the third P-channel MOS transistors;
    a third N-channel MOS transistor having a drain connected to a source of the first N-channel MOS transistor and a gate to which a first input signal is supplied;
    a fourth N-channel MOS transistor having a drain connected to a source of the second N-channel MOS transistor, a source connected to a source of the third N-channel MOS transistor, and a gate to which a second input signal is supplied;
    a fifth N-channel MOS transistor connected between the sources of the third and the fourth N-channel MOS transistors and the ground terminal, and a gate to which the output signal of the logic circuit is supplied;
    an inverter having an input terminal connected to the drains of the first and the third P-channel MOS transistors and also the drain of the first N-channel MOS transistor;
    a fifth P-channel MOS transistor connected between the power supply terminal and an signal output terminal of the tristate buffer, a gate of the fifth P-channel MOS transistor being connected to the drains of the second and the fourth P-channel MOS transistors and also the drain of the second N-channel MOS transistor; and
    a sixth N-channel MOS transistor connected between the signal output terminal and the ground termial, an output signal of the inverter being fed to a gate of the sixth N-channel MOS transistor.

4. The tristate buffer according to claim 3, wherein the second input signal is an inverted signal of the first input signal.

5. A tristate buffer comprising:
    a logic circuit configured to output an output signal in accordance with a clock signal and an enable signal;
    a first P-channel MOS transistor having a source to which power is supplied and a gate to which the output signal of the logic circuit is supplied;

a second P-channel MOS transistor having a source to which the power is supplied and a gate to which the output signal of the logic circuit is supplied;

a third P-channel MOS transistor having a source to which the power is supplied, a gate connected to a drain of the second P-channel MOS transistor, and a drain connected to a drain of the first P-channel MOS transistor;

a fourth P-channel MOS transistor having a source to which the power is supplied, a gate connected to the drain of the first P-channel MOS transistor, and a drain connected to the drain of the second P-channel MOS transistor;

a first N-channel MOS transistor having a drain connected to the drains of the first and the third P-channel MOS transistors and a gate to which the output signal of the logic circuit is supplied;

a second N-channel MOS transistor having a drain connected to the drains of the second and the fourth P-channel MOS transistors and a gate to which the output signal of the logic circuit is supplied;

a third N-channel MOS transistor connected between a source of the first N-channel MOS transistor and a ground terminal, a first input signal being fed to a gate of the third N-channel MOS transistor;

a fourth N-channel MOS transistor connected between the source of the second N-channel MOS transistor and the ground terminal, a second input signal being fed to a gate of the fourth N-channel MOS transistor;

an inverter having an input terminal connected to the drains of the first and the third P-channel MOS transistors and also the first N-channel MOS transistor;

a fifth P-channel MOS transistor having a first current path, one end of the first current path receiving the power and the other end of the first current path transmitting a signal to a signal output terminal, a gate of the fifth P-channel MOS transistor being connected to the drains of the second and the fourth P-channel MOS transistors and also the second N-channel MOS transistor; and a fifth N-channel MOS transistor having a second current path, one end of the second current path connected to the ground terminal and the other end of the second current path transmitting a signal to the signal output terminal, an output signal of the inverter being fed to a gate of the fifth N-channel MOS transistor.

6. The tristate buffer according to claim 5, wherein the second input signal is an inverted signal of the first input signal.

7. The tristate buffer according to claim 5, wherein the logic circuit comprises:

a NAND gate and an inverter connected in series, the logic circuit configured to output the output signal in accordance with the clock and enable signals supplied to the NAND gate.

8. A tristate buffer comprising:

a logic circuit configured to output an output signal in accordance with a clock signal an enable signal;

a first P-channel MOS transistor having a source to which power is supplied and a gate to which the output signal of the logic circuit is supplied;

a second P-channel MOS transistor having a source to which the power is supplied and a agate to which the output signal of the logic circuit is supplied;

a third P-channel MOS transistor having a source to which the power is supplied, a gate connected to a drain of the second P-channel MOS transistor, and a drain connected to a drain of the first P-channel MOS transistor;

a fourth P-channel MOS transistor having a source to which the power is supplied, a gate connected to the drain of the first P-channel MOS transistor, and a drain connected to the drain of the second P-channel MOS transistor;

a first N-channel MOS transistor having a drain connected to the drains of the first and the third P-channel MOS transistors and a gate connected to the drains of the second and the fourth P-channel MOS transistors;

a second N-channel MOS transistor having a drain connected to the drains of the second and the fourth P-channel MOS transistors and a gate connected to the drains of the first and the third P-channel MOS transistors;

a third N-channel MOS transistor having a drain connected to a source of the first N-channel MOS transistor and a gate to which a first input signal is supplied;

a fourth N-channel MOS transistor having a drain connected to a source of the second N-channel MOS transistor, a source connected to a source of the third N-channel MOS transistor, and a gate to which a second input signal is supplied;

a fifth N-channel MOS transistor connected between the sources of the third and the fourth N-channel MOS transistors and a ground terminal, and a gate to which the output signal of the logic circuit is supplied;

an inverter having an input terminal connected to the drains of the first and the third P-channel MOS transistors and also the first N-channel MOS transistor;

a fifth P-channel MOS transistor having a first current path, one end of the first current path receiving the power and the other end of the first current path transmitting a signal to a signal output terminal, a gate of the fifth P-channel MOS transistor being connected to the drains of the second and the fourth P-channel MOS transistors and being connected to the drain of the second N-channel MOS transistor; and a sixth N-channel MOS transistor having a second current path, one end of the second current path connected to the ground terminal and the other end of the second current path transmitting a signal to the signal output terminal, an output signal of the inverter being fed to a gate of the sixth N-channel MOS transistor.

9. The tristate buffer according to claim 8, wherein the second input signal is an inverted signal of the first input signal.

10. The tristate buffer according to claim 8, wherein the logic circuit comprises:

a NAND gate and an inverter connected in series, the logic circuit configured to output the output signal in accordance with the clock and enable signals supplied to the NAND gate.

* * * * *